(12) United States Patent
Gass et al.

(10) Patent No.: US 8,106,670 B2
(45) Date of Patent: Jan. 31, 2012

(54) TWO POLE CIRCUIT BREAKER VOLTAGE MONITORING INTEGRATION

(75) Inventors: Randall J. Gass, Cedar Rapids, IA (US); Issa Drame, Cedar Rapids, IA (US)

(73) Assignee: Schneider Electric USA, Inc., Palatine, IL (US)

( * ) Notice: Subject to any disclaimer, the term of this patent is extended or adjusted under 35 U.S.C. 154(b) by 674 days.

(21) Appl. No.: 12/277,020

(22) Filed: Nov. 24, 2008

(65) Prior Publication Data

US 2010/0127691 A1 May 27, 2010

(51) Int. Cl.
 *G01R 27/08* (2006.01)
 *G01R 31/14* (2006.01)
 *G01R 31/08* (2006.01)

(52) U.S. Cl. .......... 324/713; 324/509; 324/522

(58) Field of Classification Search .......... 324/713, 324/509, 522
See application file for complete search history.

(56) References Cited

U.S. PATENT DOCUMENTS

| | | | |
|---|---|---|---|
| 4,152,683 A | 5/1979 | Rys | |
| 4,348,709 A | 9/1982 | Mauk et al. | |
| 4,631,625 A | 12/1986 | Alexander et al. | |
| 4,918,562 A | 4/1990 | Pulizzi et al. | |
| 4,931,893 A | 6/1990 | Glennon et al. | |
| 4,937,757 A | 6/1990 | Dougherty | |
| 4,996,646 A | 2/1991 | Farrington | |
| 5,185,686 A | 2/1993 | Hansen et al. | |
| 5,196,982 A | 3/1993 | Landsberg et al. | |
| 5,629,869 A | 5/1997 | Johnson et al. | |
| 5,636,134 A | 6/1997 | Johnson et al. | |
| 5,638,296 A | 6/1997 | Johnson et al. | |
| 5,998,750 A | 12/1999 | Wegener et al. | |
| 6,118,639 A | 9/2000 | Goldstein | |
| 6,163,444 A * | 12/2000 | Lam ................ | 361/42 |
| 6,167,329 A | 12/2000 | Engel et al. | |
| 6,191,589 B1 | 2/2001 | Clunn | |
| 6,215,378 B1 | 4/2001 | Gibson et al. | |
| 6,259,340 B1 | 7/2001 | Fuhr et al. | |
| 6,285,534 B1 | 9/2001 | Gibson et al. | |
| 6,295,188 B1 | 9/2001 | Ebersohl | |
| 6,392,513 B1 | 5/2002 | Whipple et al. | |
| 6,426,632 B1 | 7/2002 | Clunn | |
| 6,426,634 B1 | 7/2002 | Clunn et al. | |
| 6,433,977 B1 | 8/2002 | Macbeth | |
| 6,538,862 B1 | 3/2003 | Mason, Jr. et al. | |
| 6,570,392 B2 | 5/2003 | Macbeth et al. | |
| 6,654,219 B1 | 11/2003 | Romano et al. | |
| 6,710,687 B2 | 3/2004 | Elms et al. | |
| 6,720,872 B1 | 4/2004 | Engel et al. | |
| 6,731,483 B2 | 5/2004 | Mason, Jr. et al. | |

(Continued)

OTHER PUBLICATIONS

Mossop, Carey, Chiste, Alan. "Can Your SPD Go to Extremes ?" ECM Magazine, Jul. 2008.

(Continued)

*Primary Examiner* — Amy He

(57) ABSTRACT

An apparatus for monitoring line voltage in a circuit breakor includes a controller configured to calculate a voltage difference between the neutral voltage and the AC line voltage of positive polarity based on a first signal and a second signal and assign, using a polarity signal, the voltage difference value to the AC line voltage of positive polarity and the second signal to the AC line voltage of negative polarity. Because the AC line voltage of positive polarity can be calculated based on the first signal and the second signal, the number of signals requiring A/D conversion is reduced, and the number of circuit components needed to measure the AC line voltage is reduced.

21 Claims, 8 Drawing Sheets

U.S. PATENT DOCUMENTS

| | | |
|---|---|---|
| 6,807,035 B1 | 10/2004 | Baldwin et al. |
| 6,807,036 B2 | 10/2004 | Baldwin et al. |
| 6,816,350 B1 | 11/2004 | Hoopes |
| 6,988,375 B2 | 1/2006 | Bashark |
| 6,999,289 B2 | 2/2006 | Macbeth et al. |
| 7,099,130 B2 | 8/2006 | Angle et al. |
| 7,177,129 B2 | 2/2007 | Arenz et al. |
| 7,190,561 B2 | 3/2007 | Pellon et al. |
| 7,190,562 B2 | 3/2007 | Pellon et al. |
| 7,193,827 B2 | 3/2007 | Reid et al. |
| 7,215,520 B2 | 5/2007 | Elms et al. |
| 7,245,470 B2 | 7/2007 | Hoopes |
| 7,253,640 B2 | 8/2007 | Engel et al. |
| 7,282,921 B2 | 10/2007 | Sela et al. |
| 7,299,143 B2 * | 11/2007 | Price .................. 702/64 |

OTHER PUBLICATIONS

*ITI (CBEMA) Curve Application Note* published by Information Technology Industry Council ("ITI"), 1250 Eye Street NW, Suite 200, Washington, DC 20005 (available on the ITIC website) (printed on Nov. 18, 2008).

* cited by examiner

TWO POLE CIRCUIT BREAKER VOLTAGE MONITORING INTEGRATION

FIELD OF THE INVENTION

The present invention relates to voltage monitoring in circuit breakers.

BACKGROUND OF THE INVENTION

A typical two-pole circuit breaker (for example, a residential two-pole circuit breaker) receives as inputs two line voltages and a neutral voltage. The two line voltages (line-to-neutral voltages) typically are 120V alternating current ("AC") signals, 180 degrees out of phase from one another. Each line voltage alternates in polarity with respect to the neutral voltage, which is determined from the two line voltages in a conventional manner. The sum of the two line voltages (the line-to-line voltage) is a 240V AC voltage.

A microprocessor or controller in the circuit breaker can be used to measure line voltages. For example, circuits can be used to divide a line voltage and output the divided signal to the microprocessor. The microprocessor includes an analog to digital (A/D) converter to receive the analog voltage and convert it to a digital voltage for measurement by the microprocessor. Microprocessors often have multiple analog inputs connected, through a multiplexer, to the A/D converter. However, the number of analog inputs is limited.

Circuit breakers generally monitor either the line-to-line voltage or the line-to neutral voltages. For a two-pole circuit breaker, measuring each of the line-to-neutral voltages would require the use of two analog inputs of the microprocessor and circuit components on the printed circuit board assembly (PCBA) for measuring each line to neutral voltage. Measuring the line-to-line voltage would also require the use of an analog input and additional circuit components on the PCBA. Thus, a total of at least three analog inputs are required to measure each of the three voltage combinations. This adds complexity, increases processing times, and consumes an additional analog input.

What is needed is a way to measure the individual line voltages, as well as the combined 240V AC signal, using fewer analog inputs and fewer circuit components. Aspects and embodiments disclosed herein are directed to addressing/solving these and other needs.

SUMMARY OF THE INVENTION

According to an aspect of the present disclosure, an apparatus for monitoring line voltage in a circuit breaker includes a controller, a neutral input for receiving a neutral voltage, a first input for receiving a first alternating current (AC) line voltage that periodically changes polarity with respect to the neutral voltage, and a second input for receiving a second AC line voltage that periodically changes polarity with respect to the neutral voltage and is 180 degrees out of phase from the first AC line voltage.

The apparatus also includes a first circuit coupled to the first input, the second input, and the controller. The first circuit is configured to output to the controller a first signal representing the voltage difference between the first AC line voltage and the second AC line voltage. The apparatus also includes a second circuit coupled to the neutral input and the controller configured to output to the controller a second signal representing the difference between the neutral input voltage and the AC line voltage of negative polarity. The apparatus also includes a third circuit coupled to the controller configured to output a polarity signal representing an identification of the AC line voltage of negative polarity.

The controller can be configured to calculate a voltage difference value representing the difference between the neutral voltage and the AC line voltage of positive polarity based on the first signal and the second signal and assign, using the polarity signal, the voltage difference value to the AC line voltage of positive polarity and the second signal to the AC line voltage of negative polarity.

The apparatus can also include a fourth circuit coupled to the controller configured to output to the controller a zero crossing signal indicating that one (or both) of the first AC line voltage and the second AC line voltage is equal to the neutral voltage.

According to another aspect of the present disclosure, an apparatus for monitoring line voltage in a circuit breaker includes a controller, a neutral input for receiving a neutral voltage, a first input for receiving a first alternating current (AC) line voltage that periodically changes polarity with respect to the neutral voltage, and a second input for receiving a second AC line voltage that periodically changes polarity with respect to the neutral voltage and is 180 degrees out of phase from the first AC line voltage. The sum of the first AC line voltage and the second AC line voltage is a line-to-line voltage between the first input and the second input.

The apparatus also includes a first circuit coupled to the first input and the controller configured to output to the controller a first signal representing the voltage difference between the first AC line voltage and the neutral voltage. The apparatus also includes a second circuit coupled to the second input and the controller configured to output to the controller a second signal representing the difference between the second AC line voltage and the neutral voltage. The apparatus also includes an A/D converter to receive the first signal and output a first digital value and to receive the second signal and output a second digital value. The controller is configured to calculate a voltage difference value representing the line-to-line voltage by adding the first digital value and the second digital value.

The apparatus may also include a third circuit comprising a voltage divider coupled to at least one of the first and second inputs and to the controller configured to output to the controller a zero crossing logic signal indicating that at least one of the first AC line voltage and the second AC line voltage is equal to the neutral voltage.

According to another aspect of the present disclosure, an apparatus for measuring voltages in a two pole circuit breaker includes a neutral input for receiving a neutral voltage, a first line input for receiving a first alternating current (AC) voltage, wherein the first AC voltage periodically alternates in polarity with respect to the neutral voltage, and a second line input for receiving a second AC voltage, wherein the second AC voltage periodically alternates in polarity with respect to the neutral line input, and wherein the second AC voltage is 180 degrees out of phase from the first AC voltage. The apparatus also includes a first circuit configured to output a first signal representing the voltage difference between the first AC voltage and the second AC voltage. The apparatus also includes a second circuit configured to output a second signal representing the voltage difference between the neutral voltage and one of the first AC voltage and the second AC voltage. The apparatus also includes a controller coupled to the first circuit and the second circuit configured to receive the first signal and the second signal and calculate a third value representing the voltage difference between the neutral voltage and the other of the first AC voltage and the second AC voltage.

Because microprocessors typically have a limited number of analog inputs connected to the microprocessor's A/D converter. Measuring three voltages, i.e., two line-to-neutral voltages and the line-to-line voltage, using only two analog inputs is advantageous as it reduces the number of analog inputs needed. Moreover, both line-to-neutral voltages and the line-to-line voltage can be measured using fewer circuit components, and specifically fewer high-voltage circuit components, saving space on a PCBA and reducing the amount of heat generated. This also reduces the number of high voltage parallel traces, which can reduce PCBA spacing requirements. Calculating a line-to-neutral voltage rather than sampling it using an A/D converter can also save computational time, as performing the calculation can take fewer microprocessor resources than performing an A/D conversion.

The foregoing and additional aspects and embodiments of the present invention will be apparent to those of ordinary skill in the art in view of the detailed description of various embodiments and/or aspects, which is made with reference to the drawings, a brief description of which is provided next.

BRIEF DESCRIPTION OF THE DRAWINGS

The foregoing and other advantages of the invention will become apparent upon reading the following detailed description and upon reference to the drawings.

DETAILED DESCRIPTION OF THE ILLUSTRATED EMBODIMENTS

Although the invention will be described in connection with certain aspects and/or embodiments, it will be understood that the invention is not limited to those particular aspects and/or embodiments. On the contrary, the invention is intended to cover all alternatives, modifications, and equivalent arrangements as may be included within the spirit and scope of the invention as defined by the appended claims.

Figure 1A:
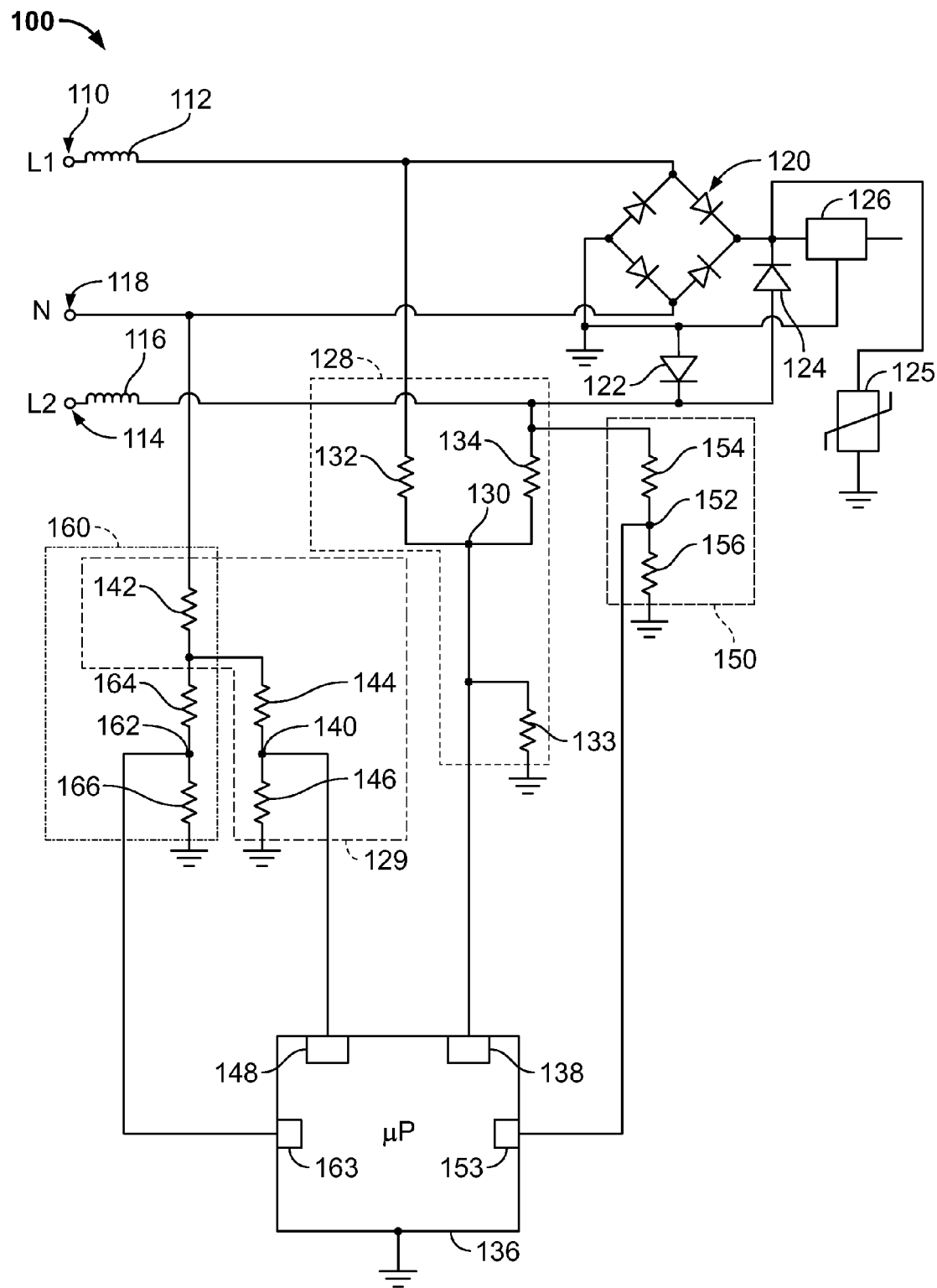
FIG. 1A is a circuit diagram of a system that includes some of the elements used in aspects of the present disclosure, including circuitry for measuring a line-to-line voltage and a line-to-neutral voltage and determining another line-to-neutral voltage, wherein a second circuit and a fourth circuit share at least one resistor.

FIG. 1A is a simplified circuit diagram illustrating aspects of the present invention, including circuitry for measuring a line-to-line voltage and a line-to-neutral voltage and determining another line-to-neutral voltage. A two pole circuit breaker 100 includes two line inputs L1 and L2 (110, 114) to receive AC input voltages (e.g., 120V AC line to neutral) through line-powered trip solenoids 112, 116, respectively, for tripping the circuit breaker 100. The circuit breaker includes an additional line input, i.e., a neutral input 118. Each of the two line voltages alternates in polarity with respect to the neutral input 118. The line voltages are 180 degrees out of phase from one another. The line-to-line voltage, or voltage difference between the two line inputs 110, 114, is a 240V AC voltage.

A full-wave diode bridge 120 and rectifying diodes 122 and 124 together rectify the voltages at line inputs 110, 114. The line voltage of positive polarity is permitted to pass through the full-wave diode bridge 120 and rectifying diodes 122, 124, while ground is pulled toward the voltage of the line input of negative polarity. The half cycle of positive polarity is input to a voltage regulator 126, which outputs a regulated voltage.

The circuit breaker 100 includes a first circuit 128 for measuring the voltage difference between the two line inputs 110, 114. The first circuit 128 includes a resistor 132, connected to the line input 110 and the resistor 134, connected to the line input 114. The resistors 132, 133, and 134 form voltage dividers between the line inputs 110, 114 and ground. The node 130, between the resistors 132, 133, and 134, is connected to a controller such as a microprocessor 136. A person of ordinary skill in the art will recognize that a variety of controllers could be used in place of a microprocessor, for example an application specific integrated circuits (ASIC), field programmable gate array (FPGA), etc. The resistors 132, 133 and 134 are configured to divide the line-to-line voltage to produce at the node 130 a voltage range that can be accepted by the microprocessor 136. For example, if the line voltage at line inputs 110 and 114 are 120V AC, the resistor 132 may be 998 kΩ, the resistor 133 may be 7.5 kΩ, and the resistor 134 may be 998 kΩ. The voltage at the node 130 represents the voltage difference between the line inputs 110 and 114. The microprocessor 136 includes an A/D converter (not shown) to receive the analog voltage from the node 130 at an analog input 138 and to convert it into a digital representation usable by the microprocessor 136 by sampling the voltage at the node 130 at regular intervals.

The circuit breaker 100 also includes a second circuit 129 for measuring the voltage difference between the neutral input 118 and whichever of the two line inputs 110, 114 is of negative polarity. The second circuit 129 includes resistors 142, 144, and 146, which form a voltage divider between the neutral input 118 and ground. The node 140 is between resistor 146 and the combined resistance of resistors 142 and 144. The voltage at the node 140 is a divided representation of the voltage difference between the voltage at the neutral input 118 and ground. Resistors 142, 144, and 146 are configured to divide the line-to-neutral voltage to produce at the node 140 a voltage range that can be accepted by the microprocessor 136. For example, if the line voltage at line inputs 110 and 114 are 120V AC, the resistor 142 may be 309 kΩ, the resistor 144 may be 196 kΩ, and the resistor 146 may be 5.9 kΩ. Because the line voltage that is at a negative polarity serves as ground, the voltage at node 140 represents the voltage difference between the neutral input 118 and whichever of the two line inputs 110, 114 is of negative polarity. For example, during the half-cycle that the line input 110 is of negative polarity with respect to the neutral line input 118, the voltage at node 140 represents the voltage difference between the neutral input 118 and line input 110. The node 140 is connected to the microprocessor 136, which includes the A/D converter to receive the analog voltage from node 140 at analog input 148 and convert it into a digital representation usable by the microprocessor 136 by sampling the voltage at node 140 at regular intervals.

The circuit breaker 100 also includes a third circuit 150 to indicate which of the line inputs 110, 114 is at a positive polarity. The third circuit 150 includes resistors 154 and 156 connected between the line input 114 and ground. The resistors 154 and 156 form a voltage divider. A node 152 is between resistors 154 and 156 and is connected to microprocessor 136. The resistors 154 and 156 are configured to divide the voltage at line input 114 to a voltage range at the node 152 that can be accepted by the microprocessor 136 at a digital input 153 without the use of an A/D converter and can be interpreted as a logic signal. For example, for a line input voltage of 120V AC at line input 114, the resistor 154 can be 974 kΩ and the resistor 156 can be 130 kΩ. The voltage at the node 152 represents the polarity of the voltage at the line input 114. If the voltage at the line input 114 is of negative polarity, the line input 114 serves as ground. Thus, the line input 114 and ground are at substantially the same potential (e.g., a diode drop away from each other), and the voltage at node 152 is zero, representing a logic value of zero. If the voltage at the line input 114 is of a positive polarity, the line input 110 (at a negative polarity) serves as ground, and there is a positive potential between the line input 114 and ground, and the node 152 is at a positive potential, representing a logic value of one. The microprocessor 136 interprets a logic value of zero at the node 152 to indicate that the line input 114 is at a negative polarity and the line input 110 is at a positive polarity. Likewise, the microprocessor 136 interprets a logic value of one at the node 152 to indicate that the line input 114 is at a positive polarity and the line input 110 is at a negative polarity.

The circuit breaker 100 can also optionally include a fourth circuit 160 to indicate when the voltage at the line input 110 or the line input 114 is equal to the voltage at the neutral input 118. If the AC line voltages at the line inputs 110 and 114 are 180 degrees out of phase, their respective voltages will be equal to the voltage at the neutral input 118 at the same time (e.g., at phase angles of zero degrees, 180 degrees, etc.). A point at which the voltage at a line input is equal to the voltage at the neutral input 118 can be referred to as a zero-crossing point. This also represents the point at which the voltage at that line input changes polarity (i.e., from positive a polarity to a negative polarity, or from a negative polarity to a positive polarity). The fourth circuit 160 includes three resistors 142, 164, and 166, which form a voltage divider between the neutral input 118 and ground. A node 162 is between the resistor 166 and the combined resistance of the resistors 142 and 164. The node 162 is connected to the microprocessor 136. The resistors 142, 164, and 166 are configured to divide the voltage between the neutral input 118 and ground to produce at the node 162 a voltage range that can be accepted by the microprocessor 136 at a digital input 163 without the use of an A/D converter and can be interpreted as a logic signal. For example, the resistor 142 may be 309 kΩ, the resistor 164 may be 196 kΩ, and the resistor 166 may be 130 kΩ.

As stated above, whichever line input 110, 114 is of negative polarity serves as ground. At a point where the voltages at the line inputs 110 and 114 are changing polarity (this will be the same point in time for both inputs when the voltages at the line inputs 110 and 114 are 180 degrees out of phase) ground will be equal to both line inputs 110, 114, and the neutral input 118. Thus, at a zero-crossing point, the neutral input 118 will be at ground, and there will be no difference in potential between the neutral input 118 and ground. Accordingly, the voltage at the node 162 will be zero, which represents a logic value of zero. When the line voltages are not at a zero-crossing point, the neutral input 118 will be at a higher potential than ground (which is substantially (e.g., about a diode drop) equal to the line input 110, 114 of negative polarity). Thus, the voltage at the node 162 will be a positive value, which represents a logic value of one. The microprocessor 136 interprets a logic value of zero at the node 162 to indicate that the line inputs 110, 114 are at a zero-crossing point. Likewise, the microprocessor 136 interprets a logic value of one at the node 152 to indicate that the line inputs 110, 114 are not at a zero-crossing point.

Figure 1B:
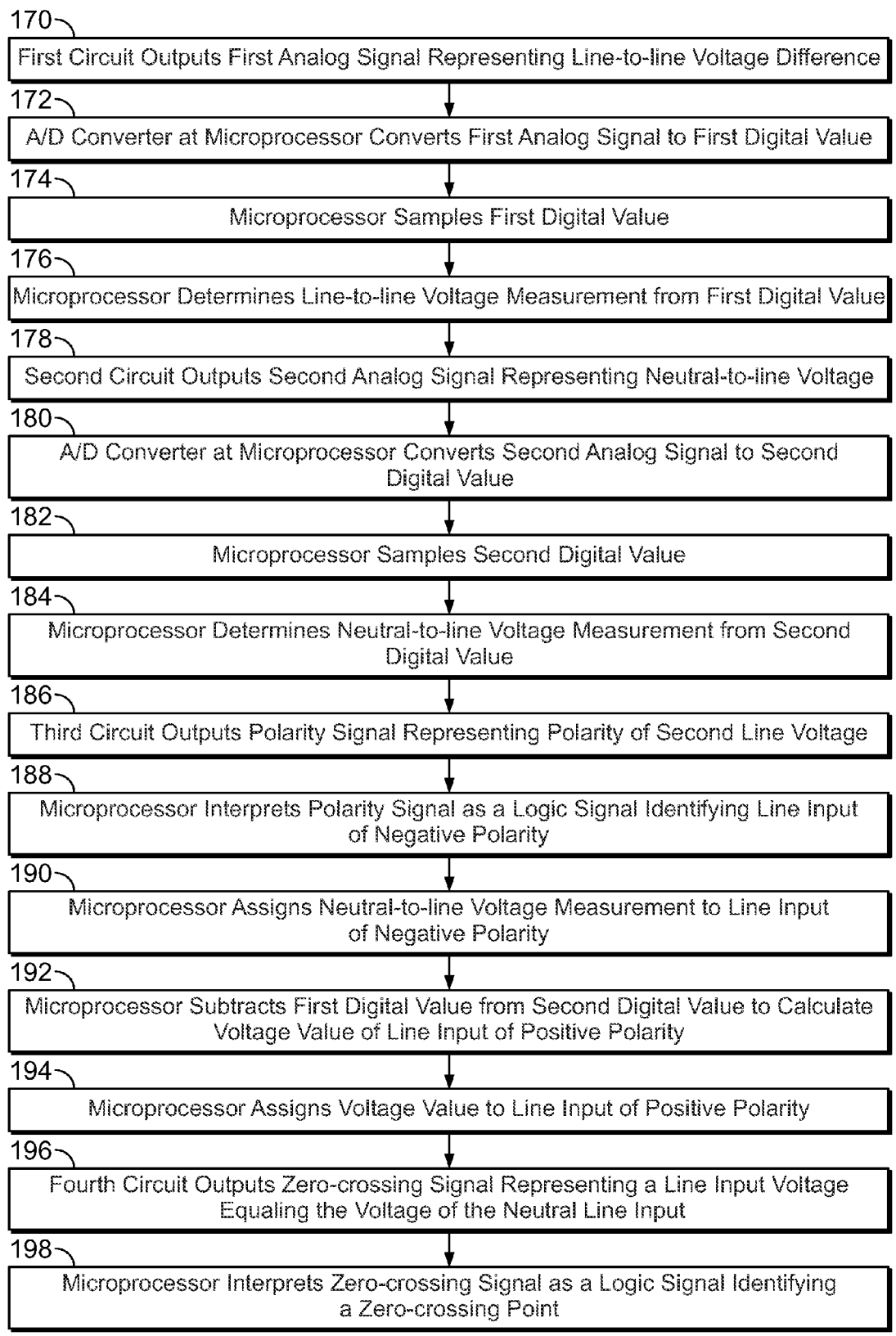
FIG. 1B is a flow chart of a method that includes some of the aspects of the present disclosure.

FIG. 1B is a flow chart illustrating a method that implements the circuits described above. The first circuit 128 outputs a first analog signal at the node 130 representing the line-to-line voltage (voltage difference between the line inputs 110 and 114) (170). This represents the instantaneous voltage of the 240V AC voltage. The A/D converter at the microprocessor 136 converts the first analog signal to a first digital value (172). The microprocessor 136 samples the first digital value (174). The microprocessor 136 is programmed to determine a line-to-line voltage measurement from the first digital value (176), for example by comparing the first digital value to a set of stored values, or by executing a function defining a relationship between the possible digital values and corresponding line-to-line voltage measurements, as is known in the art. The microprocessor 136 can store this value for use in calculations.

The second circuit 129 outputs a second analog signal at the node 140 representing the line-to-neutral voltage (the voltage difference between the neutral input 118 and the line input of 110 and 114 of a negative polarity) (178). This represents the instantaneous voltage difference between the neutral line input 118 and whichever of the two line inputs 110 and 114 is of negative polarity at that time. The A/D converter at the microprocessor 136 converts the second analog signal to a second digital value (180). The microprocessor 136 samples the second digital value (182). The microprocessor 136 is programmed to determine the line-to-neutral voltage measurement from the second digital value (184), similarly to how it determines the line-to-line voltage from the first digital value. The microprocessor 136 can store this value for use in calculations.

The third circuit 150 outputs a polarity signal at node 152 representing the polarity of the second line voltage (186). The microprocessor 136 samples the polarity signal and interprets it as a logic signal identifying the line input of 110 and 114 of a negative polarity (188). As explained above, if the line input 114 is of a negative polarity, the voltage at the node 150 will be zero; if the line input 114 is of a positive polarity, the voltage at the node 150 will be a positive value. The microprocessor 136 assigns the second digital value (representing the line-to-neutral voltage measurement) to the line input of negative polarity (190). For example, if the line input 114 is of a negative polarity, the voltage at the node 150 will be zero. The microprocessor 136 can interpret the voltage value of zero as a logic zero, and assign the second digital value to the line input 114. If the line input 114 is of a positive polarity, the voltage at the node 150 will be a positive value. The microprocessor 136 can interpret the positive voltage value as a logic one, and assign the second digital value to the line input 110. The microprocessor 136 can sample and process the first and second analog signals and the polarity signal simultaneously, consecutively, or in any order.

The microprocessor 136 is programmed to calculate a value for the line-to-neutral voltage of the line input of positive polarity from the line-to-line voltage measurement and the line-to-neutral voltage measurement of the line input of negative polarity. For example, the microprocessor 136 can be programmed to subtract the first digital value from the second digital value to calculate a voltage value of the line input of a positive polarity (192). The microprocessor 136 can include an arithmetic logic unit (ALU) to perform such calculations. The microprocessor 136 assigns this calculated voltage value to the line input of 110 and 114 of a positive polarity (194). For example, if the polarity signal is interpreted as a logic zero, the microprocessor 136 assigns the calculated voltage value to the line input 110; if the polarity signal is interpreted as a logic one, the microprocessor 136 assigns the calculated voltage value to the line input 114.

As explained above, the circuit breaker 100 may also include the fourth circuit 160. The fourth circuit 160 outputs a zero-crossing signal at node 162 indicating that the voltage of one (or both) of the line inputs 110, 114 equals the voltage of the neutral input 118 (196). The microprocessor 136 interprets the zero-crossing signal as a logic signal identifying a zero-crossing point (198). A zero-crossing point can be used by the microprocessor 136 as a timing reference. For example, the microprocessor 136 can be configured to sample a predetermined number of samples of the first and second analog signals and the polarity signal beginning when the zero-crossing signal indicates a zero-crossing point.

The polarity signal may also be used to correlate the phase of the current at each line input with the full wave rectified amplitude of the voltage. For example, a current monitoring circuit for each of the line inputs 110, 114 can be coupled to the microprocessor 136 at current monitoring inputs. The current monitoring circuits include DC offsets. By determining that the current at a current monitoring input is above or below the DC offset, the microprocessor can determine whether the current is of a positive or negative phase. This phase information can be compared to the polarity signal. If the phase information from the current monitoring input does not match the polarity signal, the line signal conductors inside the circuit breaker may be improperly connected (e.g., the line intended to be connected to line input 110 is connected to line input 114 and vise versa).

The voltage information can also be used by the microprocessor to identify problems with the voltage inputs, such as the loss of one of the line voltages (sometimes referred to as loss of phase), loss of the neutral input, loss of phase of the line voltages, etc. The voltage and current information could also be used by the microprocessor to determine information about the load on the circuit, such as how much power the load is consuming, or for use in the detection of arcing faults.

Microprocessors typically have a limited number of analog inputs connected to the microprocessor's A/D converter. If more analog inputs are required that the microprocessor has, it could be necessary to use a larger and more expensive microprocessor that has a larger number of analog inputs. In this embodiment, three voltages, i.e., the two line-to-neutral voltages and the line-to-line voltage, can be measured using only two analog inputs. Moreover, as can be seen, both line-to-neutral voltages and the line-to-line voltage can be measured using fewer circuit components, and specifically fewer high-voltage circuit components, saving space on a PCBA. This also reduces the number of high voltage parallel traces, which can reduce PCBA spacing requirements. Calculating a line-to-neutral voltage rather than sampling it using an A/D converter can also save computational time, as performing the calculation can take fewer microprocessor resources than performing an A/D conversion.

In this embodiment, the fourth circuit 160 and the second circuit 129 share at least one component, the resistor 142. Sharing components among the circuits can further reduce the number of components on the PCBA and can simplify layout of the circuitry on the PCBA.

Figure 2:
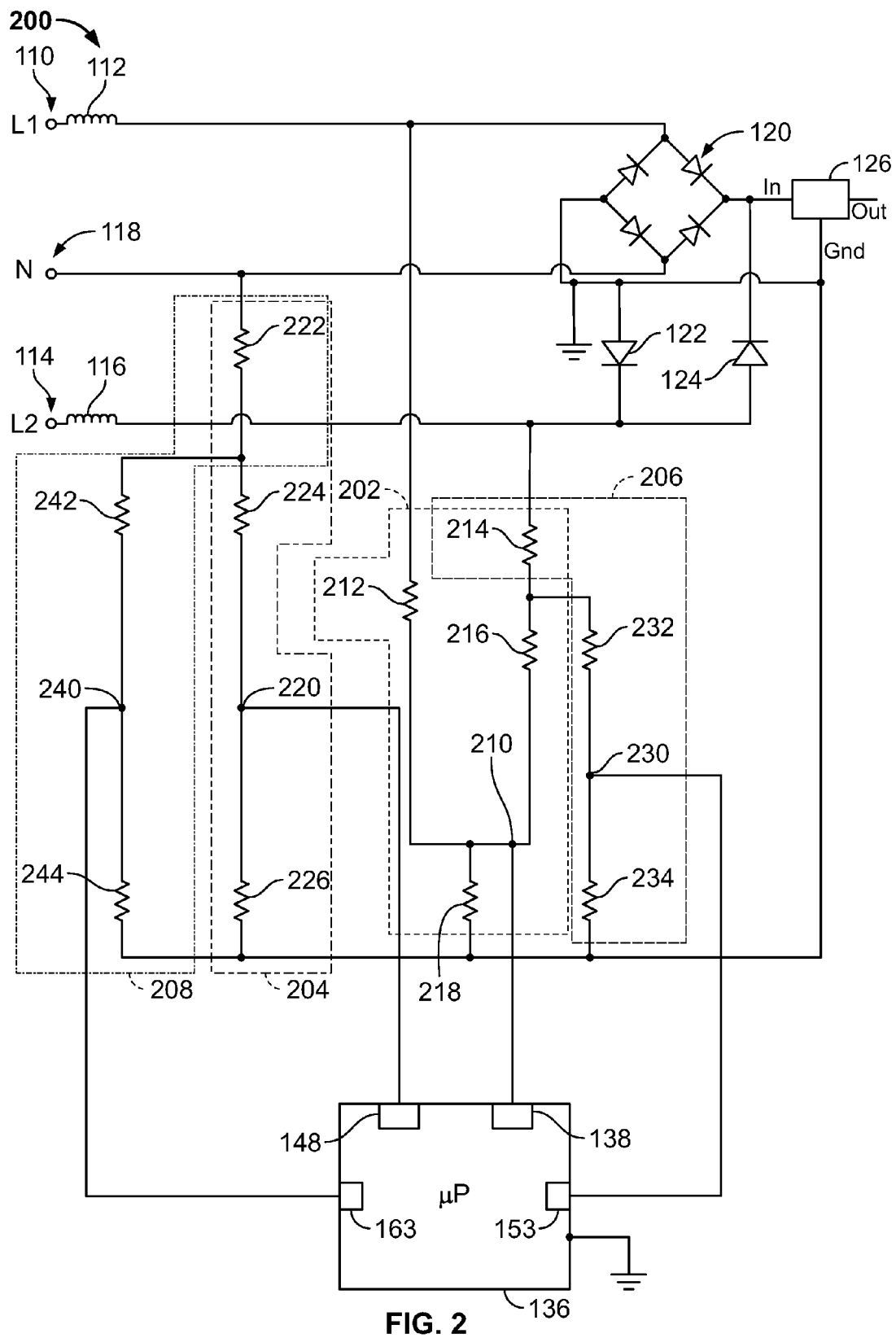
FIG. 2 is a circuit diagram of a system that includes some of the elements used in aspects of the present disclosure, including circuitry for measuring a line-to-line voltage and a line-to-neutral voltage and determining another line-to-neutral voltage, wherein a second circuit and a fourth circuit share at least one resistor and wherein a second circuit and a third circuit share at least one resistor.

FIG. 2 is a simplified circuit diagram illustrating aspects of the present invention, including circuitry for measuring a line-to-line voltage and a line-to-neutral voltage and determining another line-to-neutral voltage. As with FIG. 1A, above, a two pole circuit breaker 200 includes two line inputs L1 and L2 (110, 114) to receive AC input voltages (e.g., 120V AC) through line-powered trip solenoids 112, 116, respectively, and neutral input 118. The full-wave diode bridge 120 and the rectifying diodes 122 and 124 rectify the voltages at the line inputs 110, 114. The half cycle of positive polarity is input to the voltage regulator 126, which outputs a regulated voltage.

The circuit breaker 200 includes a first circuit 202 for measuring the voltage difference between the line inputs 110, 114. The first circuit 202 includes a resistor 212, connected to the line input 110, two resistors 214 and 216 connected in series to the line input 114, and a resistor 218 connected between the resistors 212 and 216 and ground. The resistor 212, the combination of the resistors 214, 216, and resistor 218 form voltage dividers between the line inputs 110, 114 and ground. A node 210, between the three resistors 212, 216, and 218 is connected to the microprocessor 136. The resistors 212, 214, 216, and 218 are configured to divide the line-to-line voltage to produce at the node 210 a range that can be accepted by the microprocessor 136. The voltage at the node 210 represents the voltage difference between the line inputs 110 and 114. The microprocessor 136 includes the A/D converter (not shown) to receive the analog voltage from the node 210 at the analog input 138 and convert it into a digital representation usable by the microprocessor 136 by sampling the voltage at the node 210 at regular intervals.

The circuit breaker 200 also includes a second circuit 204 for measuring the voltage difference between the neutral input 118 and whichever of the two line inputs 110, 114 is of negative polarity. The second circuit 204 includes three resistors 222, 224, and 226, which form a voltage divider between the neutral input 118 and ground. A node 220 is between the resistor 226 and the combined resistance of the resistors 222 and 224. The voltage at the node 220 is a divided down version of, and represents, the voltage difference between the voltage at the neutral input 118 and ground. The resistors 222, 224, and 226 are configured to divide the line-to-neutral voltage to produce at the node 220 a range that can be accepted by the microprocessor 136. The voltage at the node 220 represents the voltage difference between the neutral input 118 and whichever of the two line inputs 110, 114 is of a negative polarity. The node 220 is connected to the microprocessor 136, which includes the A/D converter to receive the analog voltage from the node 220 at the analog input 148 and convert it into a digital representation usable by the microprocessor 136 by sampling the voltage at the node 220 at regular intervals.

The circuit breaker 200 also includes a third circuit 206 to indicate which of the line inputs 110, 114 is at a negative polarity (and which is at a positive polarity, as the other line input will be of opposite polarity when the line voltages are 180 degrees out of phase). The third circuit 206 includes three resistors 214, 232, and 234 connected between the line input 114 and ground. The resistor 234 and the combination of the resistors 214 and 232 form a voltage divider. A node 230 is between the resistors 232 and 234, and is connected to the microprocessor 136 at the digital input 153. The resistors 214, 232, and 234 are configured to divide the voltage difference between the line input 114 and ground and produce at the node 230 a voltage range that can be accepted by the microprocessor 136 without the use of an A/D converter and can be interpreted as a logic signal. The voltage at the node 230 represents the polarity of the voltage at the line input 114. If the voltage at the line input 114 is of a negative polarity, the voltage at the node 230 will be zero, representing a logic value of zero; if the voltage at the line input 114 is of a positive polarity, the node 230 will be at a positive potential, representing a logic value of one. The microprocessor 136 interprets a logic value at the node 230 to indicate that the line input 114 is at a negative polarity and the line input 110 is at a positive polarity (for logic value of zero) or vice versa (for logic value of one).

The circuit breaker 200 may also include a fourth circuit 208 to indicate a zero-crossing point when the voltage at the line input 110 or the line input 114 is equal to the voltage at the neutral line input 118. The fourth circuit 208 includes two resistors 242 and 244, which form a voltage divider between the neutral input 118 and ground. A node 240 is between the resistor 242 and the resistor 244, and is connected to the microprocessor 136 at the digital input 163. The resistors 242 and 244 are configured to divide the voltage difference between the neutral input 118 and ground to produce at the node 240 a voltage range that can be accepted by the microprocessor 136 without the use of an A/D converter and can be interpreted as a logic signal. When the line inputs 110, 114 are at a zero-crossing point, the voltage at the node 240 is zero, which represents a logic value of zero, and is interpreted by the microprocessor 136 as a logic value of zero. When the line voltages are not at a zero-crossing point, the voltage at the node 240 is a positive value, which represents a logic value of one, and is interpreted by the microprocessor 136 as a logic value of one.

The microprocessor 136 is programmed to calculate a value for the line-to-neutral voltage of the line input of positive polarity from the line-to-line voltage measurement and the line-to-neutral voltage measurement of the line input of negative polarity in the manner described above.

In this embodiment, the third circuit 206 and the first circuit 202 share at least one component, the resistor 214. The fourth circuit 208 and the second circuit 204 also share at least one component, the resistor 222. Sharing components among the circuits can further reduce the number of components on the PCBA and can simplify layout of the circuitry on the PCBA.

Figure 3:
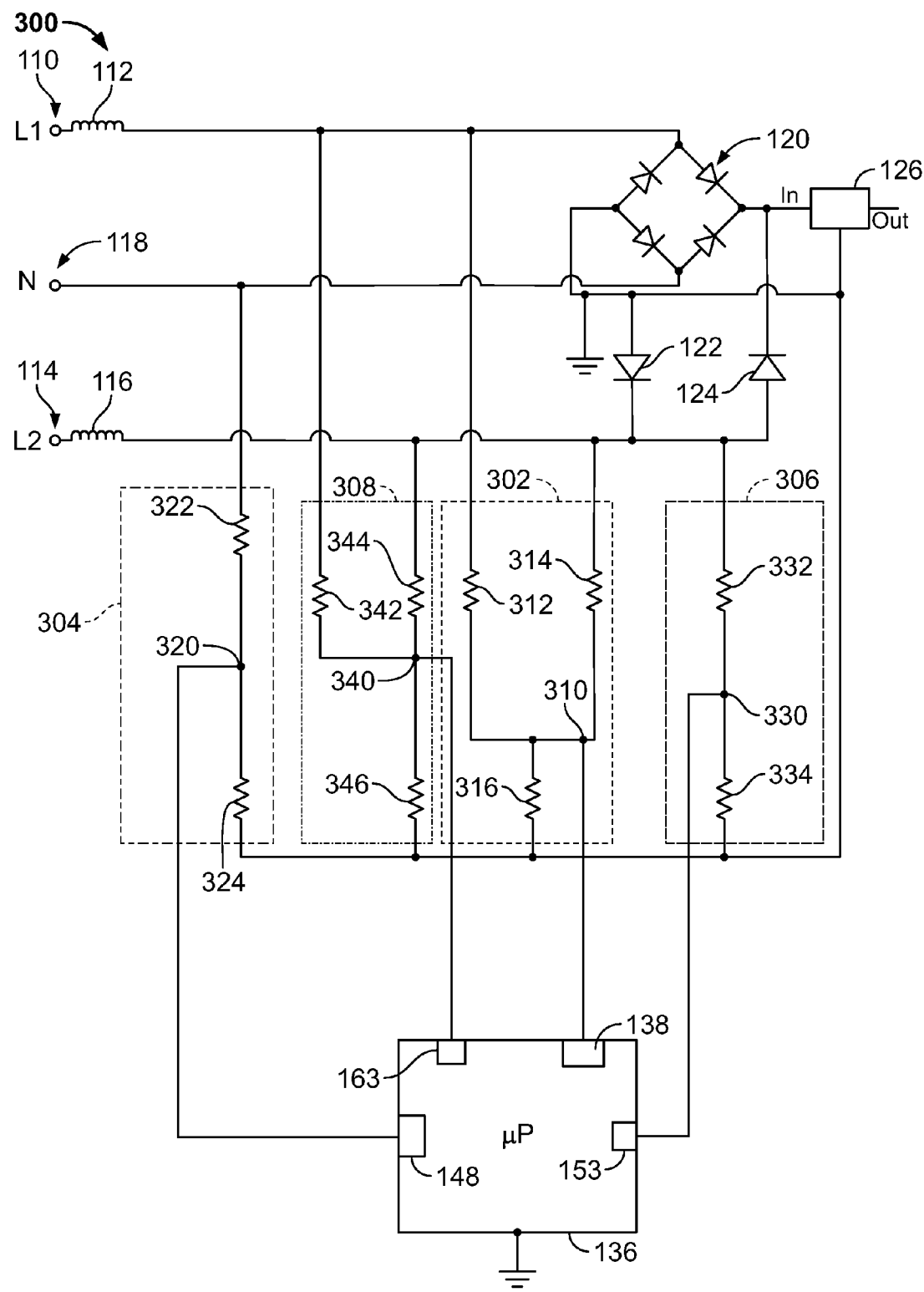
FIG. 3 is a circuit diagram of a system that includes some of the elements used in aspects of the present disclosure, including circuitry for measuring a line-to-line voltage and a line-to-neutral voltage and determining another line-to-neutral voltage, wherein first, second, third, and fourth circuits do not share resistors, and wherein the fourth circuit is connected to first and second line inputs.

FIG. 3 is a simplified circuit diagram illustrating aspects of the present invention, including circuitry for measuring a line-to-line voltage and a line-to-neutral voltage and determining another line-to-neutral voltage. As with FIG. 1A, above, a two pole circuit breaker 300 includes two line inputs L1 and L2 (110, 114) to receive AC input voltages (e.g., 120V AC) through the line-powered trip solenoids 112, 116, respectively, and the neutral input 118. The full-wave diode bridge 120 and the rectifying diodes 122 and 124 rectify the voltages at the line inputs 110, 114. The half cycle of positive polarity is input to the voltage regulator 126, which outputs a regulated voltage.

The circuit breaker 300 includes a first circuit 302 for measuring the voltage difference between the line inputs 110, 114. The first circuit 302 includes a resistor 312 connected to the line input 110, a resistor 314, connected in series to the line input 114, and a resistor 316 connected to the resistors 312 and 314 and ground. The resistors 312, 314, and 316 form voltage dividers between the line inputs 110, 114, and ground. A node 310, between the three resistors 312, 314, and 316 is connected to the microprocessor 136. The resistors 312, 314 and 316 are configured to divide the line-to-line voltage to produce at the node 310 a range that can be accepted by the microprocessor 136. The voltage at the node 310 represents the voltage difference between the line inputs 110 and 114. The microprocessor 136 includes the A/D converter (not shown), which receives the analog voltage from the node 310 at the analog input 138 and converts it into a digital representation usable by the microprocessor 136 by sampling the voltage at the node 310 at regular intervals.

The circuit breaker 300 also includes a second circuit 304 for measuring the voltage difference between the neutral input 118 and whichever of the two line inputs 110, 114 is of a negative polarity. The second circuit 304 includes two resistors 322 and 324, which form a voltage divider between the neutral input 118 and ground. A node 320 is between the resistors 322 and 324. The voltage at the node 320 is a divided representation of the voltage difference between the voltage at the neutral input 118 and ground. The resistors 322 and 324 are configured to divide the line-to-neutral voltage to produce at the node 320 a range that can be accepted by the microprocessor 136. The voltage at the node 320 represents the voltage difference between the neutral input 118 and whichever of the two line inputs 110, 114 is of a negative polarity. The node 320 is connected to the microprocessor 136, which includes the A/D converter to receive the analog voltage from node 320 at the analog input 148 and convert it into a digital representation usable by the microprocessor 136 by sampling the voltage at the node 320 at regular intervals.

The circuit breaker 300 also includes a third circuit 306 to indicate which of the line inputs 110, 114 is at a negative polarity (and which is at a positive polarity). The third circuit 306 includes two resistors 332 and 334 connected between the line input 114 and ground, and which form a voltage divider. Node 330 is between resistors 332 and 334, and is connected to the microprocessor 136 at the digital input 153. The resistors 332 and 334 are configured to divide the voltage difference between the line input 114 and ground to produce at the node 330 a voltage range that can be accepted by the microprocessor 136 without the use of an A/D converter and can be interpreted as a logic signal. The voltage at the node 330 represents the polarity of the voltage at the line input 114. If the voltage at the line input 114 is of a negative polarity, the voltage at the node 330 will be zero, representing a logic value of zero; if the voltage at the line input 114 is of a positive polarity, the node 330 will be at a positive potential, representing a logic value of one. The microprocessor 136 interprets a logic value at the node 330 to indicate that the line input 114 is at a negative polarity and the line input 110 is at a positive polarity (for logic value of zero) or vice versa (for logic value of one).

The circuit breaker 300 may also include a fourth circuit 308 to indicate a zero-crossing point when the voltage at the line input 110 or line input 114 is equal to the voltage at the neutral line 118. The fourth circuit 308 includes three resistors 342, 344 and 346. The resistors 342 and 346 form a voltage divider between line input 110 and ground, and the resistors 344 and 346 form a voltage divider between the line input 114 and ground. A node 340 is in the center of the resistors 342, 344, and 346, and is further connected to the microprocessor 136 at the digital input 163. The resistors 342, 344, and 346 are configured to divide the voltage differences between the line inputs 110, 114 and ground to produce at the node 340 a voltage range that can be accepted by the microprocessor 136 without the use of an A/D converter and can be interpreted as a logic signal. When both of the line inputs 110, 114 are at a zero-crossing point, both of the line inputs 110 and 114 will be at the same potential as ground, and the voltage at the node 340 will be zero. A voltage of zero at the node 340 represents a logic value of zero, and is interpreted by the microprocessor 136 as a logic value of zero. When the line voltages are not at a zero-crossing point, the voltage at the node 340 is a positive value, which represents a logic value of one, and is interpreted by the microprocessor 136 as a logic value of one. In this embodiment, the fourth circuit 308 is connected to the two line inputs 110, 114 rather than the neutral input 118. In the case of a loss or other defect of the neutral input, the microprocessor 136 can still detect a zero-crossing, and thus will have a timing reference to use in fault detection algorithms, such as an algorithm to detect a loss of the neutral input.

The microprocessor 136 is programmed to calculate a value for the line-to-neutral voltage of the line input of positive polarity from the line-to-line voltage measurement and the line-to-neutral voltage measurement of the line input of negative polarity in the manner described above.

In this embodiment, each of the first circuit 302, the second circuit 304, the third circuit 306, and the fourth circuit 308 is separate from the other circuits in that they do not share components with the other circuits. Keeping the circuits separate can permit tighter measurement tolerances. The fourth circuit 308 is connected between the line inputs 110, 114 and ground.

Figure 4:
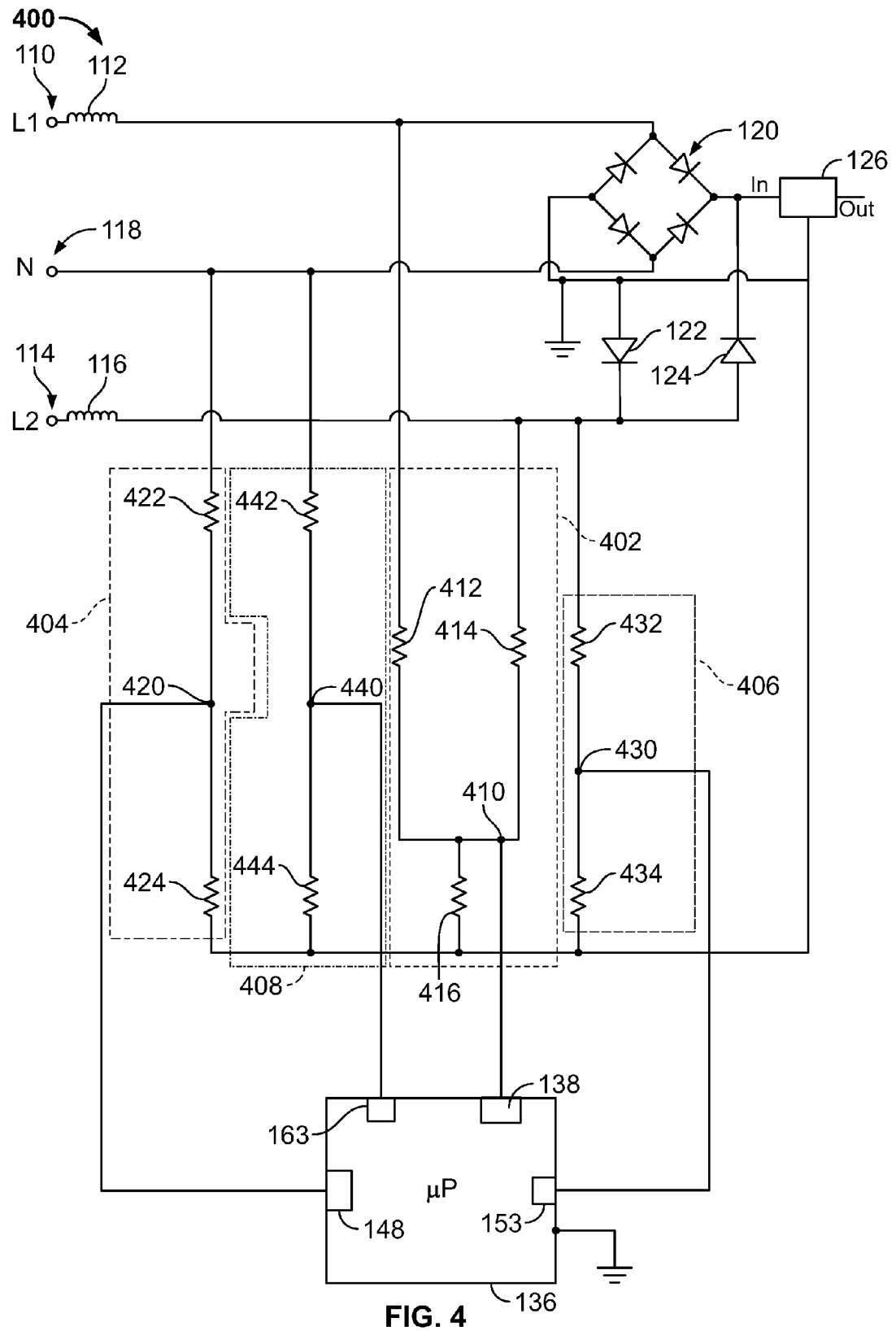
FIG. 4 is a circuit diagram of a system that includes some of the elements used in aspects of the present disclosure, including circuitry for measuring a line-to-line voltage and a line-to-neutral voltage and determining another line-to-neutral voltage, wherein first, second, third, and fourth circuits do not share resistors, and wherein the fourth circuit is connected to a neutral input.

FIG. 4 is a simplified circuit diagram illustrating aspects of the present invention, including circuitry for measuring a line-to-line voltage and a line-to-neutral voltage and determining another line-to-neutral voltage. As with FIG. 1A, above, a two pole circuit breaker 400 includes the two line inputs L1 and L2 (110, 114) to receive AC input voltages (e.g., 120V AC) through the line-powered trip solenoids 112, 116, respectively, and the neutral input 118. The full-wave diode bridge 120 and the rectifying diodes 122 and 124 rectify the voltages at the line inputs 110, 114. The half cycle of positive polarity is input to the voltage regulator 126, which outputs a regulated voltage.

The circuit breaker 400 includes a first circuit 402 for measuring the voltage difference between the line inputs 110, 114. The first circuit 402 includes a resistor 412, connected to line input 110, a resistor 414, connected to the line input 114, and a resistor 416 connected to the resistors 412 and 414 and to ground. The resistors 412, 414, and 416 form voltage dividers between the line inputs 110, 114 and ground. A node 410, between the three resistors 412, 414, and 416 is connected to the microprocessor 136. The resistors 412, 414, and 416 are configured to divide the line-to-line voltage to produce at the node 410 a range that can be accepted by the microprocessor 136. The voltage at the node 410 represents the voltage difference between the line inputs 110 and 114. The microprocessor 136 includes the A/D converter (not shown) to receive the analog voltage from the node 410 at the analog input 138 and convert it into a digital representation usable by the microprocessor 136 by sampling the voltage at the node 410 at regular intervals.

The circuit breaker 400 also includes a second circuit 404 for measuring the voltage difference between the neutral input 118 and whichever of the two line inputs 110, 114 is of negative polarity. The second circuit 404 includes two resistors 422 and 424, which form a voltage divider between the neutral input 118 and ground. A node 420 is between the resistors 422 and 424. The voltage at the node 420 is a divided representation of the voltage difference between the voltage at the neutral input 118 and ground. The resistors 422 and 424 are configured to divide the line-to-neutral voltage to produce at the node 420 a range that can be accepted by the microprocessor 136. The voltage at the node 420 represents the voltage difference between the neutral input 118 and whichever of the two line inputs 110, 114 is of negative polarity. The node 420 is connected to the microprocessor 136, which includes the A/D converter to receive the analog voltage from the node 420 at the analog input 148 and convert it into a digital representation usable by the microprocessor 136 by sampling the voltage at the node 420 at regular intervals.

The circuit breaker 400 also includes a third circuit 406 to indicate which of the line inputs 110, 114 is at a negative polarity (and which is at a positive polarity). The third circuit 406 includes two resistors 432 and 434 connected between the line input 114 and ground. The resistors 432 and 434 form a voltage divider. A node 430 is between the resistors 432 and 434, and is connected to the microprocessor 136 at the digital input 153. The resistors 432 and 434 are configured to divide the voltage difference between the line input 114 and ground to produce at the node 430 a voltage range that can be accepted by the microprocessor 136 without the use of an A/D converter and can be interpreted as a logic signal. The voltage at the node 430 represents the polarity of the voltage at the line input 114. If the voltage at the line input 114 is of a negative polarity, the voltage at the node 430 will be zero, representing a logic value of zero; if the voltage at the line input 114 is of a positive polarity, the node 430 will be at a positive potential, representing a logic value of one. The microprocessor 136 interprets a logic value at the node 430 to indicate that the line input 114 is at a negative polarity and the line input 110 is at a positive polarity (for logic value of zero) or vise versa (for logic value of one).

The circuit breaker 400 may also include a fourth circuit 408 to indicate a zero-crossing point when the voltage at the line input 110 or the line input 114 is equal to the voltage at the neutral input 118. The fourth circuit 408 includes two resistors 442 and 444, which form a voltage divider between the neutral input 118 and ground. A node 440 is between the resistors 442 and 444, and is connected to the microprocessor 136 at the digital input 163. The resistors 442 and 444 are configured to divide the voltage difference between the neutral input 118 and ground and produce at the node 440 a voltage range that can be accepted by the microprocessor 136 without the use of an A/D converter and interpreted as a logic signal. When the line inputs 110, 114 are at a zero-crossing point, the voltage at the node 440 is zero, which represents a logic value of zero, and is interpreted by the microprocessor 136 as a logic value of zero. When the line voltages are not at a zero-crossing point, the voltage at the node 440 is a positive value, which represents a logic value of one, and is interpreted by the microprocessor 136 as a logic value of one. In this embodiment, the fourth circuit 408 is connected to the neutral input 118 rather than the two line inputs 110, 114. This permits the use of fewer and smaller circuit components, such as smaller resistors, further saving PCBA space.

The microprocessor 136 is programmed to calculate a value for the line-to-neutral voltage of the line input of positive polarity from the line-to-line voltage measurement and the line-to-neutral voltage measurement of the line input of negative polarity in the manner described above.

In this embodiment, each of the first circuit 402, the second circuit 404, the third circuit 406, and the fourth circuit 408 is separate from the other circuits in that they do not share components with the other circuits. Keeping the circuits separate can permit tighter measurement tolerances. The fourth circuit 308 is connected between the neutral input 118 and ground.

Figure 5:
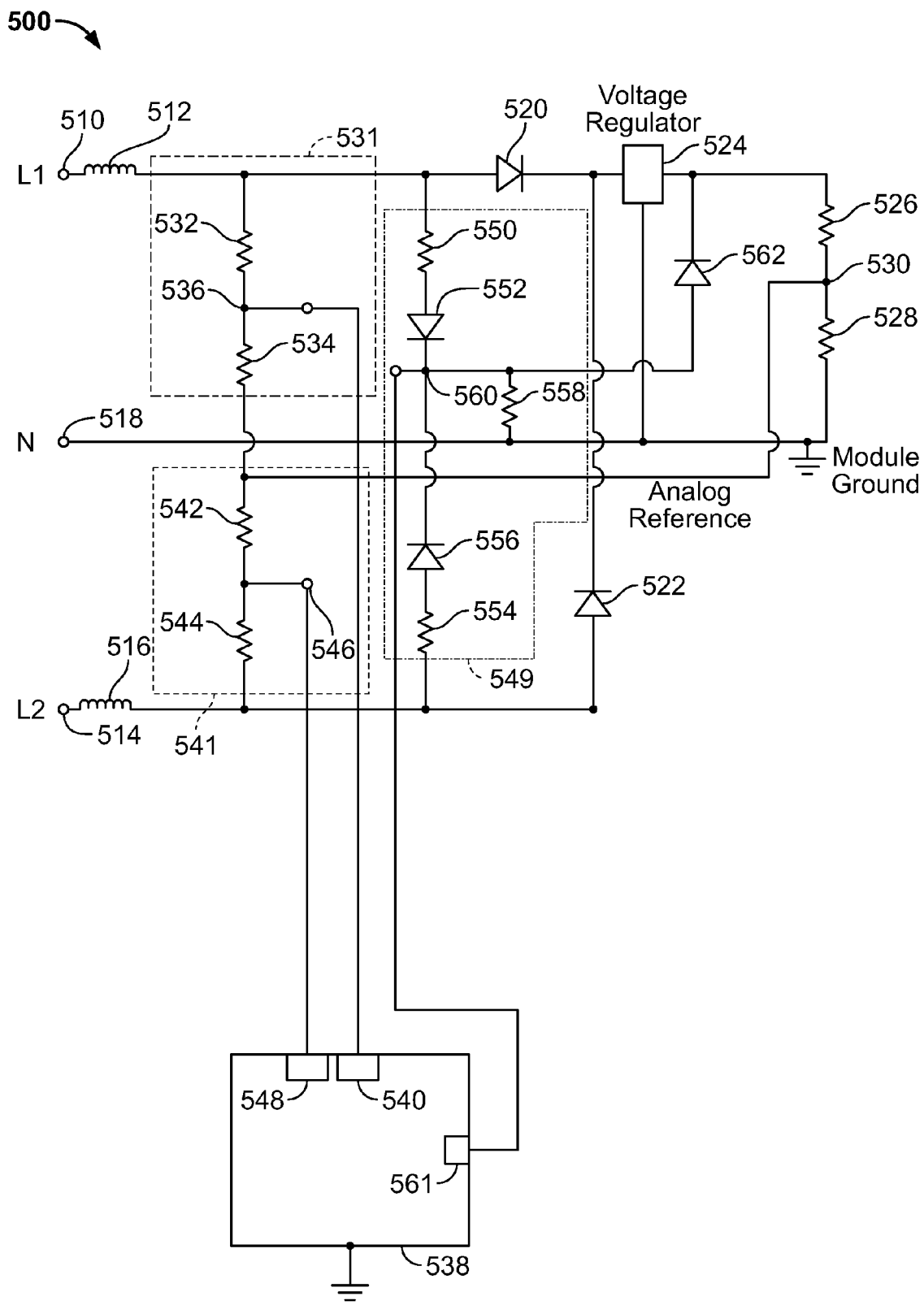
FIG. 5 is a circuit diagram of a system that includes some of the elements used in aspects of the present disclosure, including circuitry for measuring two line-to-neutral voltages and determining a line-to-line voltage, wherein first and second circuits are connected between line inputs and analog reference, respectively.

FIG. 5 is a simplified circuit diagram illustrating aspects of the present invention, including circuitry for measuring two line-to-neutral voltages and determining a line-to-line voltage. A two pole circuit breaker 500 includes two line inputs L1 and L2 (510, 514) to receive AC input voltages (e.g., 120V AC) through two line-powered trip solenoids 512, 516, respectively, and a neutral input 518. The neutral input 518 serves as ground. Two rectifying diodes 520 and 522 permit the half cycles of positive polarity from the line inputs 510 and 514, respectively, while blocking the half cycles of negative polarity. The half cycles of positive polarity are input to a voltage regulator 524, which outputs a regulated voltage. A voltage divider including two resistors 526 and 528 between the output of the voltage regulator 524 and ground produces an analog reference voltage at a node 530. The analog reference voltage could also be generated by an active circuit.

The circuit breaker 500 includes a first circuit 531 for measuring the voltage difference between the line input 510 and the neutral input 518. The first circuit 531 includes two resistors 532 and 534, which form a voltage divider between the line input 510 and the analog reference 530. The resistors 532 and 534 are configured to divide the voltage difference between the line input 510 and the analog reference 530 to produce at a node 536 a voltage range that can be accepted by a microprocessor 538 coupled to the node 536. The analog reference voltage is an offset voltage chosen to ensure that the voltages received by the microprocessor 538 is an acceptable range (e.g., the analog reference voltage can be chosen to ensure that the voltages received by the microprocessor are positive if the microprocessor cannot accept negative voltages). The first circuit 531 outputs a first analog signal at the node 536 representing the voltage difference between the line input 510 and the neutral input 518. This represents the instantaneous voltage of the 120V AC voltage at the line input 510. The node 536 is connected to the microprocessor 538 at analog input 540. An A/D converter (not shown) at the microprocessor 538 converts the first analog signal to a first digital value. The microprocessor 538 samples the first digital value. The microprocessor 538 is programmed to determine a line-to-neutral voltage measurement from the first digital value, for example by comparing the first digital value to a set of stored values, or by executing a function defining a relationship between the possible digital values and corresponding line-to-neutral voltage measurements. The microprocessor 538 can store this value for use in calculations.

The circuit breaker 500 also includes a second circuit 541 for measuring the voltage difference between the line input 514 and the neutral input 518. The second circuit 541 includes two resistors 542 and 544, which form a voltage divider between the line input 514 and the analog reference 530. The resistors 542 and 544 are configured to divide the voltage difference between the line input 514 and the analog reference 530 to produce at a node 546 a voltage range that can be accepted by the microprocessor 538. The second circuit 541 outputs a second analog signal at the node 546 representing the voltage difference between the line input 514 and the neutral input 518. This represents the instantaneous voltage of the 120V AC voltage at the line input 514. The node 546 is connected to the microprocessor 538 at analog input 548 The A/D converter at the microprocessor 538 converts the second analog signal to a second digital value. The microprocessor 538 samples the second digital value. The microprocessor 538 is programmed to determine a line-to-neutral voltage measurement from the second digital value, for example by comparing the second digital value to a set of stored values, or by executing a function defining a relationship between the possible digital values and corresponding line-to-neutral voltage measurements. The microprocessor 538 can store this value for use in calculations.

The microprocessor 538 is programmed to calculate a value for the line-to-line voltage between the line inputs 510 and 514 from the two line-to-neutral voltage measurements. For example, the microprocessor 538 can be programmed to add the first digital value to the second digital value to calculate a voltage value of the line-to-line voltage. The microprocessor 538 can include an arithmetic logic unit (ALU) to perform such calculations. In this embodiment, a polarity signal is not needed to determine which voltage measurement corresponds to which line input.

The circuit breaker 500 may also include a third circuit 549 to indicate a zero-crossing point when the voltage at the line input 510 or the line input 514 is equal to the voltage at the neutral input 518. The third circuit 549 includes three resistors 550, 554 and 558. The resistors 550 and 558 form a voltage divider between the line input 510 and the neutral input 518, and the resistors 554 and 558 form a voltage divider between the line input 514 and the neutral input 518. Two diodes 552 and 556 prevent current from flowing whichever line input is of a negative polarity. A node 560 is in the center of the resistors 550, 554, and 558, and is further connected to the microprocessor 538 at a digital input 561. The resistors 550, 554, and 558, and a diode 562, are configured to divide the voltage differences between the line inputs 510, 514 and the neutral input 518 to produce at the node 560 a voltage range that can be accepted by the microprocessor 538 without the use of an A/D converter and can be interpreted as a logic signal. When both of the line inputs 510, 514 are at a zero-crossing point, both of the line inputs 510 and 514 will be at the same potential as ground, and the voltage at the node 560 will be zero. A voltage of zero at the node 560 represents a logic value of zero, and is interpreted by the microprocessor 538 as a logic value of zero, which indicates a zero-crossing point. When the line voltages are not at a zero-crossing point, the voltage at the node 560 is a positive value, which represents a logic value of one, and is interpreted by the microprocessor 538 as a logic value of one, which indicates that the line inputs 510, 514 are not at a zero crossing point.

Figure 6:
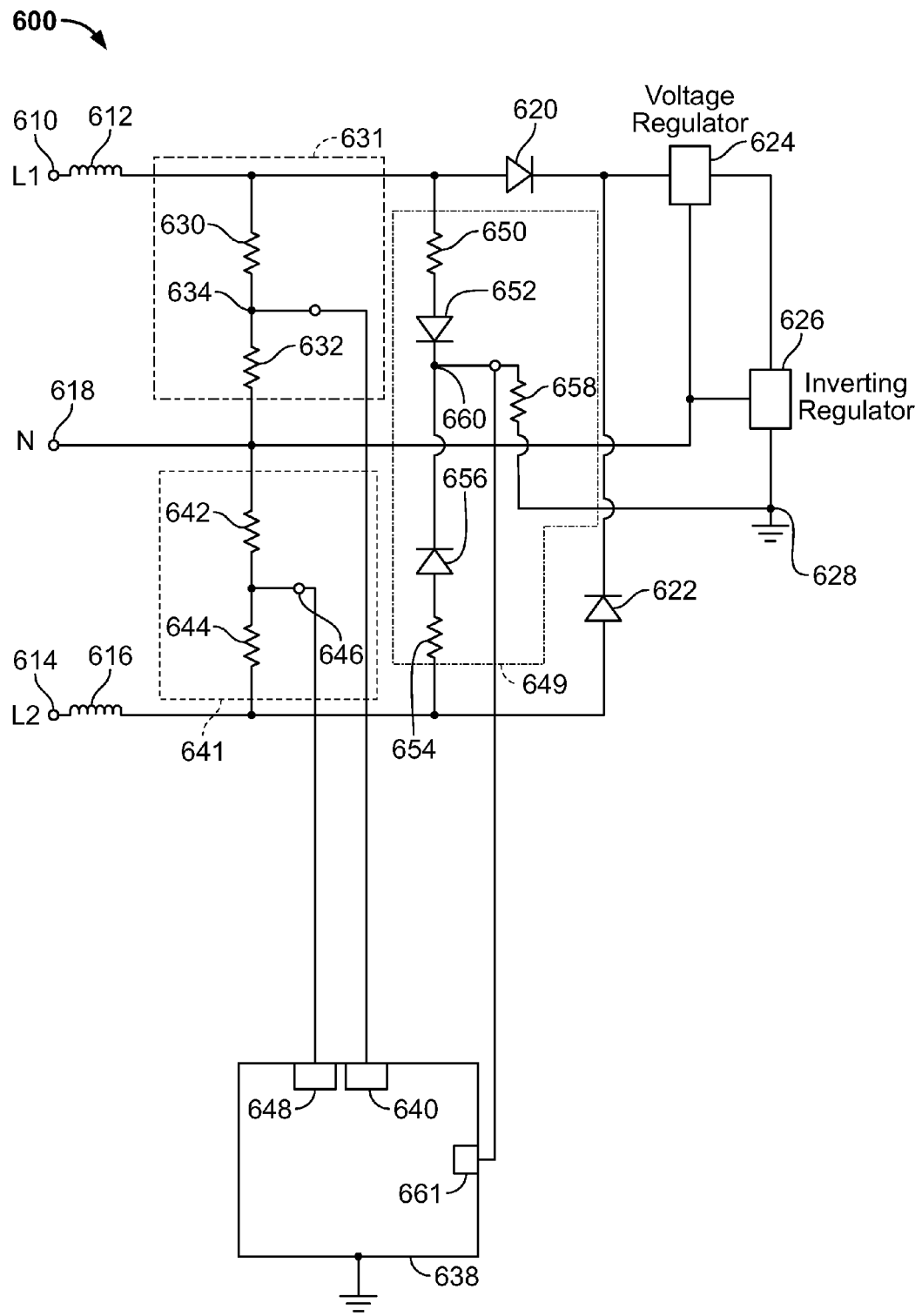
FIG. 6 is a circuit diagram of a system that includes some of the elements used in aspects of the present disclosure, including circuitry for measuring two line-to-neutral voltages and determining a line-to-line voltage, wherein first and second circuits are connected between line inputs and a neutral input, respectively.

FIG. 6 is a simplified circuit diagram illustrating aspects of the present invention, including circuitry for measuring two line-to-neutral voltages and determining a line-to-line voltage. A two pole circuit breaker 600 includes two line inputs L1 and L2 (610, 614) to receive AC input voltages (e.g., 120V AC) through two line-powered trip solenoids 612, 616, respectively, and a neutral input 618. Two rectifying diodes 620 and 622 permit the half cycles of positive polarity from the inputs 610 and 614, respectively, while blocking the half cycles of negative polarity. The half cycles of positive polarity are input to a voltage regulator 624, which outputs a regulated voltage. An inverting regulator 626 takes as input the output of the voltage regulator 624 and the neutral input 618, and outputs a negative voltage with respect to the voltage regulator ground. This negative voltage can be used as the module ground reference at a node 628.

The circuit breaker 600 includes a first circuit 631 for measuring the voltage difference between the line input 610 and the neutral input 618. The first circuit 631 includes two resistors 630 and 632, which form a voltage divider between the line input 610 and the neutral input 618. The resistors 630 and 632 are configured to divide the voltage difference between the line input 610 and the neutral input 618 to produce at a node 634 a voltage range that can be accepted by a microprocessor 638 coupled to the node 634. The first circuit 631 outputs a first analog signal at the node 634 representing the voltage difference between the line input 610 and the neutral input 618. This represents the instantaneous voltage of the 120V AC voltage at the line input 610. The node 634 is connected to the microprocessor 638 at an analog input 640. An A/D converter (not shown) at microprocessor 638 converts the first analog signal to a first digital value. The microprocessor 638 samples the first digital value. The microprocessor 638 is programmed to determine a line-to-neutral voltage measurement from the first digital value, for example by comparing the first digital value to a set of stored values, or by executing a function defining a relationship between the possible digital values and corresponding line-to-neutral voltage measurements. The microprocessor 638 can store this value for use in calculations.

The circuit breaker 600 also includes a second circuit 641 for measuring the voltage difference between the line input 614 and the neutral input 618. The second circuit 641 includes two resistors 642 and 644, which form a voltage divider between the line input 614 and the neutral input 618. The resistors 642 and 644 are configured to divide the voltage difference between the line input 614 and the neutral input 618 to produce at a node 646 a voltage range that can be accepted by the microprocessor 638. The second circuit 641 outputs a second analog signal at the node 646 representing the voltage difference between the line input 614 and the neutral input 618. This represents the instantaneous voltage of the 120V AC voltage at the line input 614. The node 646 is connected to the microprocessor 638 at an analog input 648. The A/D converter at microprocessor 638 converts the second analog signal to a second digital value. The microprocessor 638 samples the second digital value. The microprocessor 638 is programmed to determine a line-to-neutral voltage measurement from the second digital value, for example by comparing the second digital value to a set of stored values, or by executing a function defining a relationship between the possible digital values and corresponding line-to-neutral voltage measurements. The microprocessor 638 can store this value for use in calculations.

The microprocessor 638 is programmed to calculate a value for the line-to-line voltage between the line inputs 610 and 614 from the two line-to-neutral voltage measurements. For example, the microprocessor 638 can be programmed to add the first digital value to the second digital value to calculate a calculated voltage value of the line-to-line voltage. The microprocessor 638 can include an arithmetic logic unit (ALU) to perform such calculations. In this embodiment, a polarity signal is not needed to determine which voltage measurement corresponds to which line input.

The circuit breaker 600 may also include a third circuit 649 to indicate a zero-crossing point when the voltage at line input 610 or the line input 614 is equal to the voltage at the neutral input 618. The third circuit 649 includes three resistors 650, 654 and 658. The resistors 650 and 658 form a voltage divider between the line input 610 and ground 628, and the resistors 654 and 658 form a voltage divider between the line input 614 and ground 628. Two diodes 652 and 656 prevent current from flowing whichever line input is of a negative polarity. A node 660 is in the center of the resistors 650, 654, and 658, and is further connected to the microprocessor 638 at a digital input 661. The resistors 650, 654, and 658 are configured to divide the voltage differences between the line inputs 610, 614 and ground 628 to produce at the node 660 a voltage range that can be accepted by the microprocessor 638 without the use of an A/D converter and can be interpreted as a logic signal. When both of the line inputs 610, 614 are passing through a zero-crossing point, both of the line inputs 610 and 614 will be at the same potential as the neutral input 618, and the voltage at the node 660 will be zero. A voltage of zero at the node 660 represents a logic value of zero, and is interpreted by the microprocessor 638 as a logic value of zero, which indicates a zero-crossing point. When the line voltages are not at a zero-crossing point, the voltage at the node 660 is a positive value, which represents a logic value of one, and is interpreted by the microprocessor 638 as a logic value of one, which indicates that the line inputs 610, 614 are not at a zero crossing point.

Figure 7:
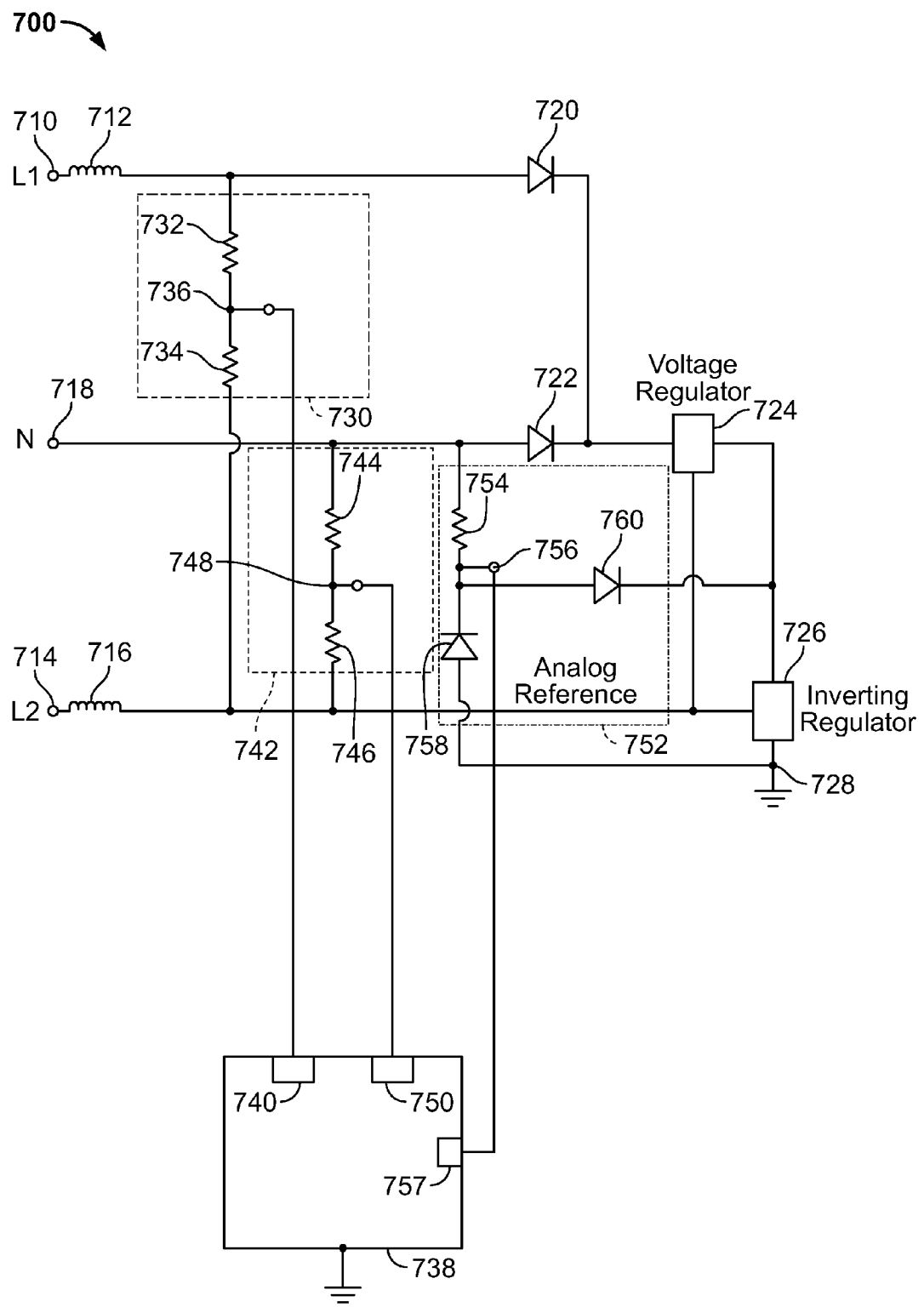
FIG. 7 is a circuit diagram of a system that includes some of the elements used in aspects of the present disclosure, including circuitry for measuring a line-to-line voltage and a line-to-neutral voltage and determining another line-to-neutral voltage without a circuit to determine polarity.

FIG. 7 is a simplified circuit diagram illustrating aspects of the present invention, including circuitry for measuring a line-to-line voltage and a line-to-neutral voltage and determining another line-to-neutral voltage, without a circuit to determine polarity. A two pole circuit breaker 700 includes two line inputs L1 and L2 (710, 714) to receive AC input voltages (e.g., 120V AC) through two line-powered trip solenoids 712, 716, respectively, and a neutral input 718. In normal operation, diode 720 half wave rectifies the AC line voltages; if there is a loss of phase or other defect on line input 710, diode 722 half wave rectifies the line voltage at line input 714. An inverting regulator 726 takes as input the output of the voltage regulator 724 and the line input 714 (which serves as an analog reference), and outputs a ground at a node 728.

The circuit breaker 700 includes a first circuit 730 for measuring the line-to-line voltage difference between the line input 710 and the line input 714. The first circuit 730 includes two resistors 732 and 734, which form a voltage divider between the line input 710 and the line input 714. The resistors 732 and 734 are configured to divide the voltage difference between the line input 710 and the line input 714 to produce at a node 736 a voltage range that can be accepted by a microprocessor 738 coupled to the node 736. The first circuit 730 outputs a first analog signal at the node 736 representing the line-to-line voltage difference. This represents the instantaneous voltage of the 240V AC voltage between the line inputs 710 and 714. The node 736 is connected to the microprocessor 738 at an analog input 740. An A/D converter (not shown) at the microprocessor 738 converts the first analog signal to a first digital value. The microprocessor 738 samples the first digital value. The microprocessor 738 is programmed to determine a line-to-line voltage measurement from the first digital value, for example by comparing the first digital value to a set of stored values, or by executing a function defining a relationship between the possible digital values and corresponding line-to-line voltage measurements. The microprocessor 738 can store this value for use in calculations.

The circuit breaker 700 also includes a second circuit 742 for measuring the voltage difference between the line input 714 and the neutral input 718. The second circuit 742 includes two resistors 744 and 746, which form a voltage divider between the line input 714 and the neutral input 718. The resistors 744 and 746 are configured to divide the voltage difference between the line input 714 and the neutral input 718 to produce at a node 748 a voltage range that can be accepted by the microprocessor 738. The second circuit 742 outputs a second analog signal at the node 748 representing the voltage difference between the line input 714 and the neutral input 718. This represents the instantaneous voltage of the 120V AC voltage at the line input 714. The node 748 is connected to the microprocessor 738 at an analog input 750. The A/D converter at the microprocessor 738 converts the second analog signal to a second digital value. The microprocessor 738 samples the second digital value. The microprocessor 738 is programmed to determine a line-to-neutral voltage measurement from the second digital value, for example by comparing the second digital value to a set of stored values, or by executing a function defining a relationship between the possible digital values and corresponding line-to-neutral voltage measurements. The microprocessor 738 can store this value for use in calculations.

The microprocessor 738 is programmed to calculate a value for the line-to-neutral voltage between the line input 710 and the neutral input 718 from the line-to-line measurement and the line-to-neutral measurement between the line input 714 and the neutral input 718. For example, the microprocessor 738 can be programmed to subtract the second digital value from the first digital value to calculate a calculated voltage value of the line-to-neutral voltage between the line input 710 and the neutral input 718. The microprocessor 738 can include an arithmetic logic unit (ALU) to perform such calculations. In this embodiment, a polarity signal is not needed to determine which voltage measurement corresponds to which line input.

The circuit breaker 700 may also include a third circuit 752 to indicate a zero-crossing point when the voltage at the line input 710 or the line input 714 is equal to the voltage at the neutral input 718. The third circuit 752 includes a resistor 754 and diodes 758 and 760, configured to keep the voltage at a node 756 in a range that can be accepted by the microprocessor 738 without the use of an A/D converter and can be interpreted as a logic signal. The node 756 is coupled to the microprocessor 738 at a digital input 757. The neutral input 718 is at a different potential than ground 728, and the relationship changes as the line inputs 710, 714 switch polarity. When both of the line inputs 710, 714 transition from one polarity to the other, the signal at the node 756 changes states (e.g., from zero voltage to a positive voltage, or vice versa). A voltage of zero at the node 756 represents a logic value of zero, and is interpreted by the microprocessor 738 as a logic value of zero. Likewise, a positive voltage at the node 756 represents a logic value of one, and is interpreted by the microprocessor 738 as a logic value of one. The microprocessor 738 can be programmed to determine that a transition from logic zero to logic one, or a transition from logic one to logic zero, indicates a zero crossing point.

What has been shown is that a line-to-line voltage and two line-to-neutral voltages can be measured using only two of a limited number of analog inputs of a microprocessor. Also, the number of circuit components and high-voltage traces needed to measure a line-to-line voltage and two line-to-neutral voltages can be reduced, saving space on a PCBA.

While particular aspects, embodiments, and applications of the present invention have been illustrated and described, it is to be understood that the invention is not limited to the precise construction and compositions disclosed herein and that various modifications, changes, and variations may be apparent from the foregoing descriptions without departing from the spirit and scope of the invention as defined in the appended claims.

What is claimed is:

1. An apparatus for monitoring line voltage in a circuit breaker, comprising:
    a controller;
    a neutral input for receiving a neutral voltage;
    a first input for receiving a first alternating current (AC) line voltage that periodically changes polarity with respect to the neutral voltage;
    a second input for receiving a second AC line voltage that periodically changes polarity with respect to the neutral voltage and is 180 degrees out of phase from the first AC line voltage;
    a first circuit coupled to the first input, the second input, and the controller configured to output to the controller a first signal representing the voltage difference between the first AC line voltage and the second AC line voltage;
    a second circuit coupled to the neutral input and the controller configured to output to the controller a second signal representing the difference between the neutral input voltage and the AC line voltage of negative polarity;
    a third circuit coupled to the controller configured to output a polarity signal representing an identification of the AC line voltage, of the first AC line voltage and second AC line voltage, of negative polarity; and
    wherein the controller is configured to:
        calculate a voltage difference value representing the difference between the neutral voltage and the AC line voltage, of the first AC line voltage and second AC line voltage, of positive polarity based on the first signal and the second signal; and
        assign, using the polarity signal, the voltage difference value to the AC line voltage of positive polarity and the second signal to the AC line voltage of negative polarity.

2. The apparatus of claim 1, further comprising a fourth circuit coupled to the controller configured to output to the controller a zero crossing signal indicating that at least one of the first AC line voltage and the second AC line voltage is equal to the neutral voltage.

3. The apparatus of claim 2, wherein the controller is configured to interpret the polarity signal and the zero crossing signal as logic signals.

4. The apparatus of claim 1, further comprising:
    at least one A/D converter to receive the first signal and output a first digital signal and
    to receive the second signal and output a second digital signal.

5. The apparatus of claim 4, wherein the controller comprises an arithmetic logic unit to calculate the voltage difference between the neutral voltage and the AC voltage of positive polarity by subtracting the second digital signal from the first digital signal.

6. The apparatus of claim 1, further comprising:
    a first trip solenoid coupled to the first input;
    a second trip solenoid coupled to the second input;
    a bridge rectifier coupled to the first input and the neutral input;
    a diode pair connected to the second input; and
    a voltage regulator coupled to the first input, the second input, and the neutral input through the bridge rectifier and the diode pair.

7. The apparatus of claim 1, wherein:
    the first circuit comprises a voltage divider coupled to at least one of the first input and the second input;
    the second circuit comprises a voltage divider coupled to the neutral input; and the third circuit comprises a voltage divider coupled to one of the first input and the second input.

8. The apparatus of claim 1, wherein the fourth circuit comprises a voltage divider coupled to the neutral input.

9. The apparatus of claim 1, wherein the fourth circuit comprises a voltage divider coupled to one of the first input and the second input.

10. The apparatus of claim 1, further comprising at least one current monitoring circuit coupled to the controller configured to output to the controller a current monitoring signal, and wherein the controller is configured to determine from the polarity signal and the current monitoring signal that a line signal conductor is improperly connected.

11. The apparatus of claim 1, wherein the controller is configured to detect an arcing fault.

12. An apparatus for monitoring line voltage in a circuit breaker, comprising:
a controller;
a neutral input for receiving a neutral voltage;
a first input for receiving a first alternating current (AC) line voltage that periodically changes polarity with respect to the neutral voltage;
a second input for receiving a second AC line voltage that periodically changes polarity with respect to the neutral voltage and is 180 degrees out of phase from the first AC line voltage, wherein the sum of the first AC line voltage and the second AC line voltage is a line-to-line voltage between the first input and the second input;
a first circuit coupled to the first input and the controller configured to output to the controller a first signal representing the voltage difference between the first AC line voltage and the neutral voltage;
a second circuit coupled to the second input and the controller configured to output to the controller a second signal representing the difference between the second AC line voltage and the neutral voltage;
at least one A/D converter to receive the first signal and output a first digital value and to receive the second signal and output a second digital value; and
wherein the controller is configured to:
calculate a voltage difference value representing the line-to-line voltage by adding the first digital value and the second digital value.

13. The apparatus of claim 12, wherein:
the first circuit comprises a voltage divider; and
the second circuit comprises a voltage divider.

14. The apparatus of claim 12, further comprising:
a third circuit comprising a voltage divider coupled to at least one of the first and second inputs and to the controller configured to output to the controller a zero crossing logic signal indicating that one of the first AC line voltage and the second AC line voltage is equal to the neutral voltage.

15. An apparatus for measuring voltages in a two pole circuit breaker, comprising:
a neutral input for receiving a neutral voltage;
a first line input for receiving a first alternating current (AC) voltage, wherein the first AC voltage periodically alternates in polarity with respect to the neutral voltage;
a second line input for receiving a second AC voltage, wherein the second AC voltage periodically alternates in polarity with respect to the neutral line input, and wherein the second AC voltage is 180 degrees out of phase from the first AC voltage;
a first circuit configured to output a first signal representing the voltage difference between the first AC voltage and the second AC voltage;
a second circuit configured to output a second signal representing the voltage difference between the neutral voltage and one of the first AC voltage and the second AC voltage; and
a controller coupled to the first circuit and the second circuit configured to receive the first signal and the second signal and calculate a third value representing the voltage difference between the neutral voltage and the other of the first AC voltage and the second AC voltage.

16. The apparatus of claim 15, wherein:
the first circuit is coupled to the first line input and the second line input;
the second circuit is coupled to the first line input;
the controller comprises at least one A/D converter to generate a first digital representation of the first signal and a second digital representation of the second signal; and
wherein the controller is configured to calculate the third value by subtracting the first digital representation from the second digital representation, and wherein the third value is representative of the second AC voltage.

17. The apparatus of claim 15, further comprising:
a third circuit configured to generate a polarity signal indicating which of the first AC voltage and second AC voltage is of negative polarity, and wherein:
the first circuit is coupled to the first line input and the second line input;
the second circuit is coupled to the neutral line input, and the second signal represents the difference between the neutral voltage and the voltage, of the first AC voltage and the second AC voltage, that has a negative polarity;
the controller comprises at least one A/D converter to generate a first digital representation of the first signal and a second digital representation of the second signal; and
the controller is configured to calculate the third value by subtracting the first digital representation from the second digital representation, and wherein the third value is representative of the voltage, of the first AC voltage and the second AC voltage, that has a positive polarity.

18. The apparatus of claim 17, further comprising a zero crossing detection circuit configured to output a zero crossing signal representing that one of the first AC voltage and the second AC voltage is equal to the neutral voltage.

19. The apparatus of claim 18, wherein:
the first circuit comprises a voltage divider;
the second circuit comprises a voltage divider;
the third circuit comprises a voltage divider; and
the zero crossing circuit comprises a voltage divider.

20. The apparatus of claim 17, wherein the second circuit and the third circuit are separate.

21. The apparatus of claim 17, wherein the second circuit and the third circuit share at least one circuit component.

* * * * *